(12) United States Patent
Chung et al.

(10) Patent No.: US 11,671,690 B2
(45) Date of Patent: *Jun. 6, 2023

(54) CAMERA MODULE HAVING A SOLDERING PORTION COUPLING A DRIVING DEVICE AND A CIRCUIT BOARD

(71) Applicant: LG INNOTEK CO., LTD., Seoul (KR)

(72) Inventors: Jong Ho Chung, Seoul (KR); Sung Il Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/653,985

(22) Filed: Mar. 8, 2022

(65) Prior Publication Data

US 2022/0201171 A1 Jun. 23, 2022

Related U.S. Application Data

(63) Continuation of application No. 17/172,391, filed on Feb. 10, 2021, now Pat. No. 11,303,787, which is a
(Continued)

(30) Foreign Application Priority Data

Nov. 6, 2015 (KR) .................. 10-2015-0155557
Dec. 1, 2015 (KR) .................. 10-2015-0169957

(51) Int. Cl.
*H04N 23/55* (2023.01)
*G02B 7/08* (2021.01)
(Continued)

(52) U.S. Cl.
CPC ............. *H04N 23/55* (2023.01); *G02B 7/006* (2013.01); *G02B 7/08* (2013.01); *G02B 7/09* (2013.01);
(Continued)

(58) Field of Classification Search
CPC .... H04N 5/2254; H04N 5/2253; H04N 23/54; H04N 23/55; G02B 7/006; G02B 7/08;
(Continued)

(56) References Cited

U.S. PATENT DOCUMENTS

| 7,378,645 B2 | 5/2008 | Mihara et al. |
| 8,760,570 B2 * | 6/2014 | Yu .................. H04N 5/2257 348/340 |

(Continued)

FOREIGN PATENT DOCUMENTS

| CN | 102279453 A | 12/2011 |
| CN | 104347659 A | 2/2015 |

(Continued)

OTHER PUBLICATIONS

International Search Report in International Application No. PCT/KR2016/012504, filed Nov. 2, 2016.
(Continued)

*Primary Examiner* — Luong T Nguyen
(74) *Attorney, Agent, or Firm* — Saliwanchik, Lloyd & Eisenschenk

(57) ABSTRACT

A camera module of an embodiment may comprise: a first holder in which a filter is mounted; a lens barrel that is provided to be vertically movable in a first direction with respect to the first holder; a lens operating device that comprises a terminal and moves the lens barrel in the first direction; a first circuit board that is disposed under the first holder and on which an image sensor is mounted; a soldering portion for electrically connecting the terminal of the lens operating device to the first circuit board; and a coupling reinforcement portion that is disposed to face the soldering portion and couples the lens operating device and the first circuit board.

20 Claims, 10 Drawing Sheets

Related U.S. Application Data continuation of application No. 16/531,661, filed on Aug. 5, 2019, now Pat. No. 10,958,813, which is a continuation of application No. 15/772,451, filed as application No. PCT/KR2016/012504 on Nov. 2, 2016, now Pat. No. 10,419,650.

(51) Int. Cl.
| | | |
|---|---|---|
| *G02B 27/64* | (2006.01) | |
| *H05K 3/30* | (2006.01) | |
| *H04N 23/54* | (2023.01) | |
| *G02B 7/00* | (2021.01) | |
| *G02B 7/09* | (2021.01) | |
| *H05K 1/02* | (2006.01) | |
| *H05K 1/14* | (2006.01) | |
| *H05K 3/34* | (2006.01) | |
| *H05K 1/03* | (2006.01) | |

(52) U.S. Cl.
CPC ............ *G02B 27/646* (2013.01); *H04N 23/54* (2023.01); *H05K 3/305* (2013.01); *H05K 1/0281* (2013.01); *H05K 1/0306* (2013.01); *H05K 1/147* (2013.01); *H05K 3/341* (2013.01); *H05K 2201/0175* (2013.01); *H05K 2201/09036* (2013.01); *H05K 2201/10121* (2013.01); *H05K 2201/10151* (2013.01)

(58) Field of Classification Search
CPC ........ G02B 7/09; G02B 27/646; H05K 3/305; H05K 1/0281; H05K 1/0306; H05K 1/147; H05K 3/341; H05K 2201/0175; H05K 2201/09036; H05K 2201/10121; H05K 2201/10151; Y02P 70/50; G03B 13/36; G03B 5/00
See application file for complete search history.

(56) References Cited

U.S. PATENT DOCUMENTS

| | | | |
|---|---|---|---|
| 9,241,097 B1 * | 1/2016 | Tam | ................... H04N 5/2254 |
| 9,712,732 B2 | 7/2017 | Kaneko et al. | |
| 9,736,378 B2 | 8/2017 | Kim et al. | |
| 10,419,650 B2 | 9/2019 | Chung et al. | |
| 10,958,813 B2 | 3/2021 | Chung et al. | |
| 11,303,787 B2 * | 4/2022 | Chung | ................... G02B 7/006 |
| 2005/0200012 A1 * | 9/2005 | Kinsman | ........... H01L 27/14618 |
| | | | 257/737 |
| 2008/0131112 A1 * | 6/2008 | Aoki | ..................... G03B 17/48 |
| | | | 348/E5.025 |
| 2010/0085474 A1 | 4/2010 | Morita | |
| 2011/0122267 A1 | 5/2011 | Ahn et al. | |
| 2012/0250156 A1 | 10/2012 | Asakawa et al. | |
| 2013/0136437 A1 | 5/2013 | Asakawa et al. | |
| 2015/0130975 A1 | 5/2015 | Ueno et al. | |
| 2016/0191767 A1 | 6/2016 | Otani et al. | |
| 2017/0330847 A1 | 11/2017 | Dobashi et al. | |
| 2018/0364444 A1 | 12/2018 | Park et al. | |
| 2019/0064476 A1 | 2/2019 | Matsuhisa et al. | |

FOREIGN PATENT DOCUMENTS

| | | |
|---|---|---|
| CN | 104380705 A | 2/2015 |
| JP | 2007-181212 A | 7/2007 |
| JP | 2008-504739 A | 2/2008 |
| KR | 10-2004-0084446 A | 10/2004 |
| KR | 10-0810284 B1 | 3/2008 |
| KR | 10-2010-0019685 A | 2/2010 |
| KR | 10-1009834 B1 | 1/2011 |
| KR | 10-2012-0007728 A | 1/2012 |
| KR | 10-2015-0080815 A | 7/2015 |
| KR | 10-2015-0089648 A | 8/2015 |
| WO | 2015/015986 A1 | 2/2015 |
| WO | 2015/025742 A1 | 2/2015 |

OTHER PUBLICATIONS

Non-Final Office Action dated Dec. 14, 2018 in U.S. Appl. No. 15/772,451.
Notice of Allowance dated May 2, 2019 in U.S. Appl. No. 15/772,451.
Office Action dated Dec. 31, 2019 in Chinese Application No. 201680065011.5.
Office Action dated Jul. 24, 2020 in U.S. Appl. No. 16/531,661.
Notice of Allowance dated Nov. 16, 2020 in U.S. Appl. No. 16/531,661.
Office Action dated Jun. 25, 2021 in Chinese Application No. 202011097761.5.
Office Action dated Aug. 27, 2021 in Korean Application No. 10-2015-0169957.
Office Action dated Sep. 1, 2021 in Korean Application No. 10-2015-0155557.
Office Action dated Aug. 19, 2021 in U.S. Appl. No. 17/172,391.
Notice of Allowance dated Dec. 8, 2021 in U.S. Appl. No. 17/172,391.

* cited by examiner

CAMERA MODULE HAVING A SOLDERING PORTION COUPLING A DRIVING DEVICE AND A CIRCUIT BOARD

CROSS-REFERENCE TO RELATED APPLICATIONS

This application is a continuation of U.S. application Ser. No. 17/172,391, filed Feb. 10, 2021; which is a continuation of U.S. application Ser. No. 16/531,661, filed Aug. 5, 2019, now U.S. Pat. No. 10,958,813, issued Mar. 23, 2021; which is a continuation of U.S. application Ser. No. 15/772,451, filed Apr. 30, 2018, now U.S. Pat. No. 10,419,650, issued Sep. 17, 2019; which is the U.S. national stage application of International Patent Application No. PCT/KR2016/012504, filed Nov. 2, 2016, which claims priority to Korean Patent Application Nos. 10-2015-0155557, filed Nov. 6, 2015; and 10-2015-0169957, filed Dec. 1, 2015, the disclosures of each of which are incorporated herein by reference in their entirety.

TECHNICAL FIELD

Embodiments relate to a camera module.

BACKGROUND ART

The statements in this section merely provide background information related to the embodiments and may not constitute prior art.

In recent years, IT devices such as a mobile phone with a camera installed therein, a smart-phone, a tablet PC, a laptop computer, etc. have been actively developed.

In the case of a camera module mounted in a small electronic device such as a smart-phone, the camera module may include a device for auto-focusing. Specifically, a lens driving device for auto-focusing and a circuit board that is coupled to the lens driving device and accommodates an image sensor can be provided in the camera module.

Meanwhile, if an external force is applied to the camera module, the lens driving device may be separated from the circuit board. If the lens driving device and image sensor are separated from each other, the quality of an image captured by the camera module may be degraded.

In particular, when the lens driving device is separated from the circuit board, the lens driving device cannot properly perform the auto-focusing function, and thus the resolution of the image captured by the camera module may also be degraded.

The camera module mounted in a small electronic device such as a smart phone can be composed of the lens driving device and the circuit board coupled to the lens driving device.

The lens driving device may include at least one lens, an auto-focusing device for focusing on the lens in an optical axis direction, and a vibration compensation mechanism for inhibiting image quality degradation due to user's hand shaking.

The circuit board can be coupled to the lens driving device and may include an image sensor for capturing an image of a subject, various elements for controlling the lens driving device, circuit patterns, terminals, and the like.

In addition, a portion of the circuit board may be made of a flexible material. If the flexible portion of the circuit board repeatedly deforms due to continuous external forces, it may cause cracks and damages to the circuit patterns, terminals and the like included in the circuit board, and the cracks and damages may cause malfunction of the camera module.

DISCLOSURE OF THE INVENTION

Technical Tasks

Accordingly, the embodiments relate to a camera module in which a lens driving device is strongly coupled to a circuit board on which an image sensor is mounted.

In addition, the embodiments relate to a camera module capable of inhibiting or remarkably reducing the occurrence of cracks and damages at components mounted on a circuit board even when the circuit board repeatedly deforms due to continuous external forces.

It will be appreciated by persons skilled in the art that the tasks that could be achieved with the embodiments are not limited to what has been particularly described hereinabove and other tasks will be more clearly understood from the following detailed description.

Technical Solutions

According to an embodiment, a camera module may include: a first holder on which a filter is mounted; a lens barrel configured to be able to move up and down in a first direction with respect to the first holder; a lens driving device configured to move the lens barrel in the first direction and include a terminal; a first circuit board on which an image sensor is mounted, wherein the first circuit board is configured to be disposed on bottom of the first holder; a soldering portion configured to electrically connect the terminal of the lens driving device and the first circuit board; and a coupling reinforcement portion configured to be disposed to face toward the soldering portion and couple the lens driving device and the first circuit board.

According to another embodiment, a camera module may include: a lens driving device; a first circuit board on which an image sensor is mounted, wherein the first circuit board is configured to be disposed on bottom of the lens driving device; a soldering portion configured to be disposed to one end of the lens driving device and electrically connect the lens driving device and the first circuit board; a coupling reinforcement portion configured to be disposed on the other end of the lens driving device to face toward the soldering portion and couple the lens driving device and the first circuit board; and a flexible circuit board configured to be electrically connected to the first circuit board, wherein a lower surface of the coupling reinforcement portion may be configured to be coupled to an upper surface of the first circuit board or an upper surface of the flexible circuit board.

According to a further embodiment, a camera module may include: a first circuit board configured to be coupled to a lens driving device, wherein a first terminal is provided on one surface of the first circuit board; a second circuit board made of a flexible material, wherein a second terminal to be coupled to the first terminal is formed on one surface of the second circuit board, and wherein when the first terminal and the second terminal are coupled to each other, the second terminal is partially exposed; and a first reinforcement portion configured to, when the first terminal and the second terminal are coupled to each other, cover an exposed area of the second terminal and be coupled to each of the first and second terminals.

Advantageous Effects

According to the embodiments, even when an external force is repeatedly applied to the camera module, it is possible to inhibit or remarkably reduce separation between the lens driving device and first circuit board resulting from a broken coupling therebetween at the opposite side of the soldering portion while maintaining the coupling therebetween around the soldering portion.

In addition, according to the embodiments, the coupling reinforcement portion can inhibit or remarkably reduce separation between the lens driving device and first circuit board even when an external force is applied to the camera module. Therefore, the camera module can inhibit or remarkably reduce the degradation of the quality and resolution of an image caused by the separation between the lens driving device and first circuit board.

Moreover, according to the embodiments, since the camera module has a structure where the first reinforcement portion covers an exposed area of the second terminal, the camera module can inhibit the second circuit board made of a flexible material from being deformed, thereby inhibiting or remarkably reducing the occurrence of damages and cracks at the circuit pattern formed across the first terminal, second terminal, and second circuit board, which is caused when the second circuit board is deformed.

Further, according to the embodiments, since the camera module includes a second reinforcement portion or third reinforcement portion, the camera module can inhibit the flexible second circuit board from being deformed, thereby inhibiting or remarkably reducing the occurrence of damages and cracks at the circuit pattern formed across the first terminal, second terminal, and second circuit board.

DESCRIPTION OF DRAWINGS

FIGS. 3 and 4 illustrate the lens barrel according to an embodiment.

BEST MODE FOR INVENTION

Figure 1:
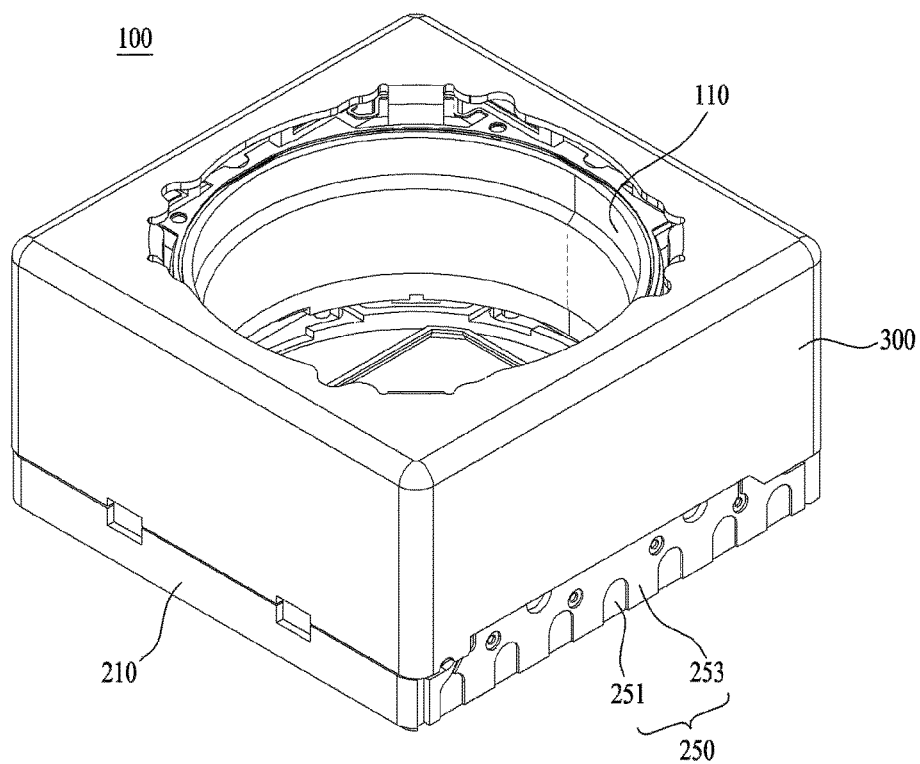
FIG. 1 is a perspective view schematically illustrating the lens driving device according to an embodiment.

Reference will now be made in detail to the preferred embodiments, examples of which are illustrated in the accompanying drawings. While the embodiments are susceptible to various modifications and alternative forms, specific embodiments thereof are shown by way of example in the drawings. However, the invention should not be construed as limited to the embodiments set forth herein, but on the contrary, the invention is to cover all modifications, equivalents, and alternatives falling within the spirit and scope of the embodiments. In the drawings, sizes and shapes of elements may be exaggerated for convenience and clarity of description.

It may be understood that, although the terms "first," "second," etc. may be used herein to describe various elements, these elements are not to be limited by these terms. The terms are generally used to distinguish one element from another. In addition, terms particularly defined in consideration of the construction and operation of the embodiments are used only to describe the embodiments and do not define the scope of the embodiments.

In the following description, when an element is referred to as being formed "on" or "under" another element, it can be directly "on" or "under" the other element or be indirectly formed with intervening one or more elements therebetween. It will also be understood that "on" or "under" the element may be described relative to the drawings.

In addition, relative terms such as "first", "second", "on/upper/above" and "beneath/lower/below" used in the following description may be used to distinguish any one substance or element with another substance or element without requiring or containing any physical or logical relationship or sequence between these substances or elements.

In the drawings, a rectangular coordinate system (x, y, z) may be used. In the drawings, the x and y axes are perpendicular to an optical axis. For the sake of convenience, an optical axis (z-axis) direction may be referred to as a first direction, an x-axis direction may be referred to as a second direction, and a y-axis direction may be referred to as a third direction.

Figure 2:
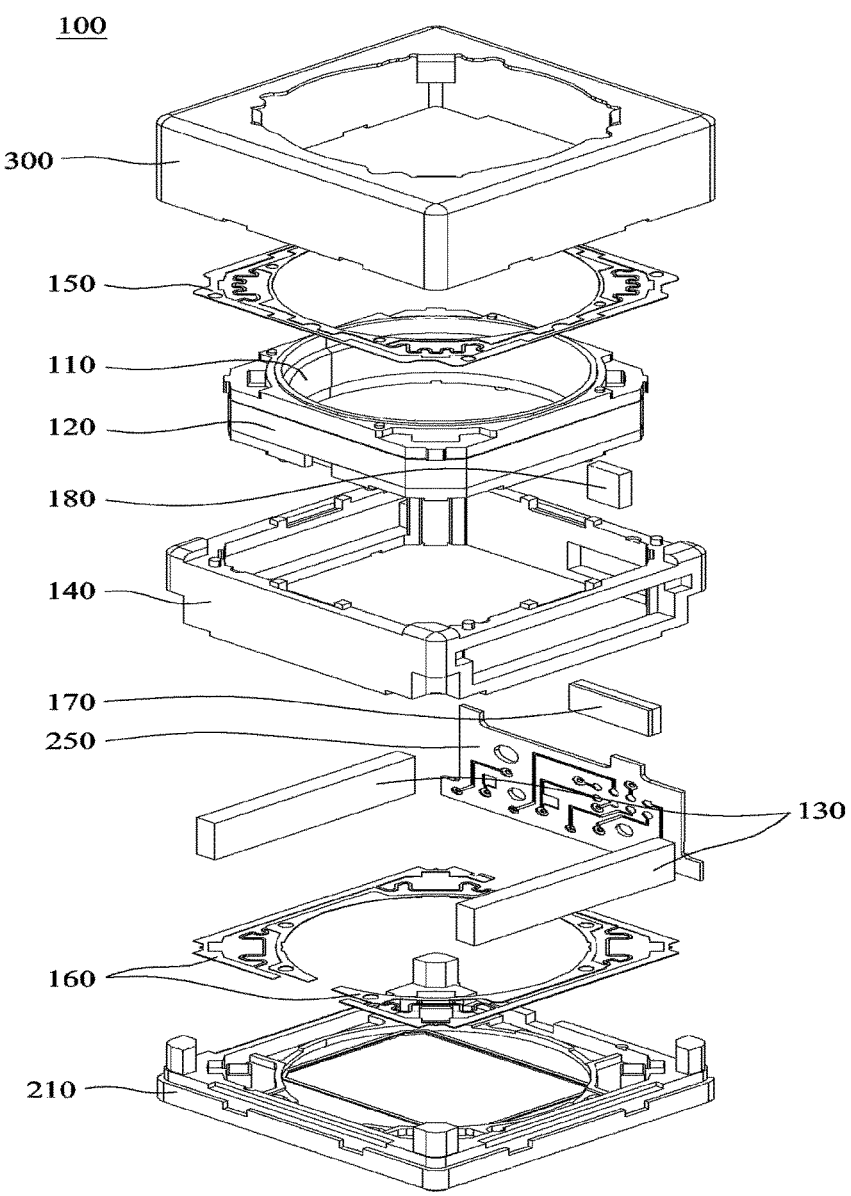
FIG. 2 is an exploded perspective view illustrating the lens driving device according to an embodiment.

FIG. 1 is a perspective view schematically illustrating the lens driving device according to an embodiment, and FIG. 2 is an exploded perspective view illustrating the lens driving device according to an embodiment.

The auto-focusing device applied to a compact camera module in the mobile device such as a smart phone, table PC, etc. is a device for enabling an image sensor 810 (cf. FIG. 5) to automatically focusing on a subject.

Although there are various auto-focusing devices, this embodiment can perform auto-focusing by moving an optical module composed of a plurality of lens in the first direction.

As shown in FIG. 2, the lens driving unit 100 according to an embodiment may be divided into a moving part and a fixed part. In this case, the moving part may perform the auto-focusing function. The moving part may include a bobbin 110, a first coil 120, and the fixed part may include a first magnet 130, a housing 140, an upper elastic member 150, a lower elastic member 160, a location detection sensor 170, and a second magnet 180.

The first coil 120, which is disposed inside the first magnet 130, is provided on an outer circumference surface of the bobbin 110. In this case, the bobbin 110 may be installed such that it can move in the first direction within the interior space of the housing 140 based on electromagnetic interaction between the first magnet 130 and first coil 120.

The first coil 120 is installed on the outer circumference surface of the bobbin 110, and it can electromagnetically interact with the first magnet 130. In this case, the first coil 120 and the first magnet 130 may be disposed to face with each other.

In addition, since the bobbin 110 is elastically supported by the top and lower elastic members 150 and 160, it can perform the auto-focusing function by moving in the first direction.

A lens barrel 400 where at least one lens is installed may be disposed within the bobbin 110. Details of the lens barrel 400 will be described with reference to the drawing.

The auto-focusing function is controlled according to current direction and can be implemented using an operation of moving the bobbin 110 in the first direction. For example, if current is applied in the forward direction, the bobbin 110 may move up from the initial position. If current is applied in the reverse direction, the bobbin 110 may move down from the initial position. In addition, it is possible to increase or decrease moving distance in a certain direction by controlling the amount of current flowing in the corresponding direction.

A plurality of top and bottom support bumps may be formed by being protruded from the top and lower surfaces of the bobbin 110. The top support bump may be formed in the shape of a cylinder or prism and used to couple and fix the upper elastic member 150.

Similar to the above-described top support bump, the bottom support bump may be formed in the shape of a cylinder or prism and used to couple and fix the lower elastic member 160.

The upper elastic member 150 may be provided at the top of the bobbin 110, and the lower elastic member 160 may be provided at the bottom of the bobbin 110. In this case, an opening corresponding to the top support bump may be formed in the upper elastic member 150, and an opening corresponding to the bottom support bump may be formed in the lower elastic member 160. The support bumps and openings may be coupled to each other through an adhesion member such as a thermosetting material, an epoxy, etc.

The housing 140 has a hollow pillar for supporting the first magnet 130, and the pillar may be formed in the shape of a quadrangle. The housing 140 may be coupled to the first magnet 130. In addition, as described above, the bobbin 110 moving in the first direction under the guidance of the elastic members 150 and 160 may be disposed within the housing 140.

The housing may include four flat side surfaces. One side surface of the housing 140 may be formed to be equal to or larger than the area of the first magnet 130. In addition, opening or grooves for accommodating a pair of the first magnets 130 may be provided on two side surfaces facing each other among the four side surfaces of the housing 140.

Thus, the pair of the first magnets 130 may be symmetrically arranged with respect to the center of the housing 140. If the first magnets 130 are arranged such that they face each other, being biased to one side regardless of the center of the housing 140, electromagnetic force is also applied to one side of the first coil 120 in the bobbin 110, and thus the bobbin 110 may be tilted.

Therefore, it is desirable to arrange the pair of the first magnets 130 symmetrically with respect to the center of the housing 140.

In addition, an opening for accommodating the location detection sensor 170, which will be described later, may be provided on one of the remaining side surfaces except the side surfaces for accommodating the first magnets 130 among the four side surfaces of the housing 140.

The upper and lower elastic members 150 and 160 may be coupled to the bobbin 110 and housing 140 and disposed on the top and bottom of the bobbin 110 and housing 140, respectively.

The upper and lower elastic members 150 and 160 may elastically support up and down movements of the bobbin 110 in the first direction. Each of the upper and lower elastic members 150 and 160 can be implemented as a plate spring.

As shown in FIG. 2, the lower elastic member 160 may be divided into two parts. Due to this two-division structure, opposite polarity current and voltage can be applied to the individual parts of the lower elastic member 160.

In addition, in a modified version of this embodiment, the upper elastic member 150 can be divided into two parts, and the lower elastic member 160 can be implemented in an integrated form.

Meanwhile, the upper elastic member 150, lower elastic member 160, bobbin 110, and housing 140 may be assembled all together by a bonding material such as an adhesive and/or a thermosetting material. In this case, for example, the upper elastic member 150, lower elastic member 160, bobbin 110, and housing 140 may be fixed together by a thermosetting material, and then an adhesive may be applied to complete the bonding.

The location detection sensor 170 may serve as a displacement detection unit for determining a displacement value of the bobbin 110 in the first direction through interaction with the second magnet 180 in the bobbin 110, which will be described later.

The location detection sensor 170 may be a sensor for detecting a change in magnetic force emitted from the second magnet 180 in the bobbin 170. In addition, the location detection sensor 170 may be a hall sensor.

However, this is merely exemplary, and the present embodiment is not limited thereto. In other words, any sensor capable of detecting change in magnetic force can be used. Further, any sensor capable of detecting a location instead of magnetic force can also be used. For example, a photoreflector can be used.

The second magnet 180 may be coupled to the bobbin 110. Thus, when the bobbin 110 moves in the first direction, the second magnet 180 can also move in the first direction as the same distance as the bobbin 110 does.

In addition, the second magnet 180 may be composed of a single body. The second magnet 180 may be arranged such that the N pole is at the top of the bobbin 110 and the S pole is at the bottom of the bobbin 110. However, the invention is not limited thereto, and the opposite arrangement is possible.

Moreover, the second magnet 180 may be composed of two parts divided along a plane perpendicular to the optical axis. The second magnet 180 may be placed away from the location detection sensor 170 by a predetermined distance in the first direction.

A base 210 is disposed on the bottom of the bobbin 110, and it may be formed in the shape of a quadrangle. In the base 210, a printed circuit board 250 and the lower elastic member 160 may be seated. In addition, a cover member 300 may be attached to the top of the base 210, and in this case, the base 210 and cover member 300 may be fixed at each contact end and sealed with an adhesive.

The printed circuit board 250 may be coupled to one side surface of the housing 140. A terminal surface 253 may be formed within the printed circuit board 250. A plurality of terminals 251 are disposed on the terminal surface 253, and current may be provided to the first coil 120 in the bobbin 10 and the location detection sensor 170 when external power is provided.

The number of terminals 251 of the printed circuit board 250 may vary according to types of components that need to be controlled. Meanwhile, in the present embodiment, the printed circuit board 250 may be implemented as a flexible printed circuit board (FPCB).

The printed circuit board 250 may include a control unit for readjusting the amount of current applied to the first coil 120 based on the displacement value detected by the displacement detection unit. That is, the control unit may be mounted on the printed circuit board 250.

In addition, in another embodiment, the control unit may be mounted on another circuit board rather than the printed circuit board 250. This may be the circuit board where an image sensor 810 is mounted or a different extra circuit board.

The cover member 300 may be formed in the shape of a box and accommodate the moving part, a portion of the printed circuit board 250, and the like. In addition, it may be coupled to the base 210.

The cover member 300 protects the moving part, the printed circuit board 250, and the like accommodated therein. In particular, the cover member 300 can focus an electromagnetic field, which is generated by the first magnet 130, the first coil 120, and the like accommodated therein, by inhibiting the electromagnetic field from leaking to the outside.

Figure 3:
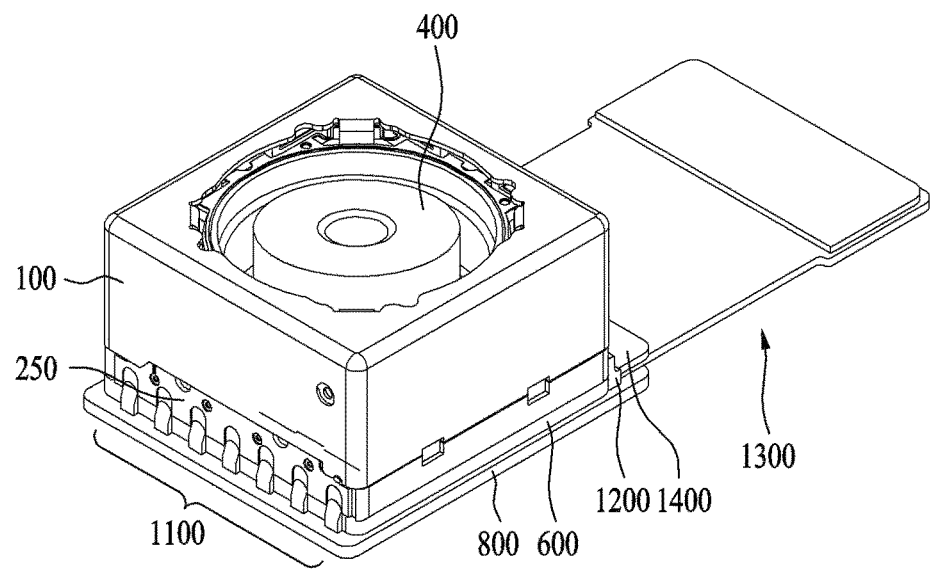
FIGS. 3 and 4 are perspective views illustrating the camera module according to an embodiment. In addition.
Figure 4:
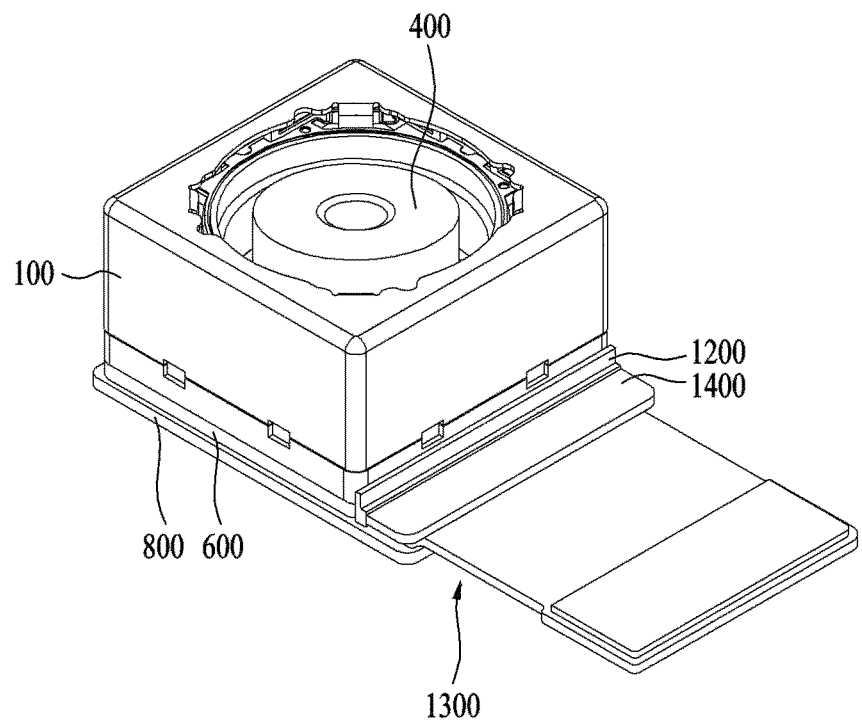
Figure 5:
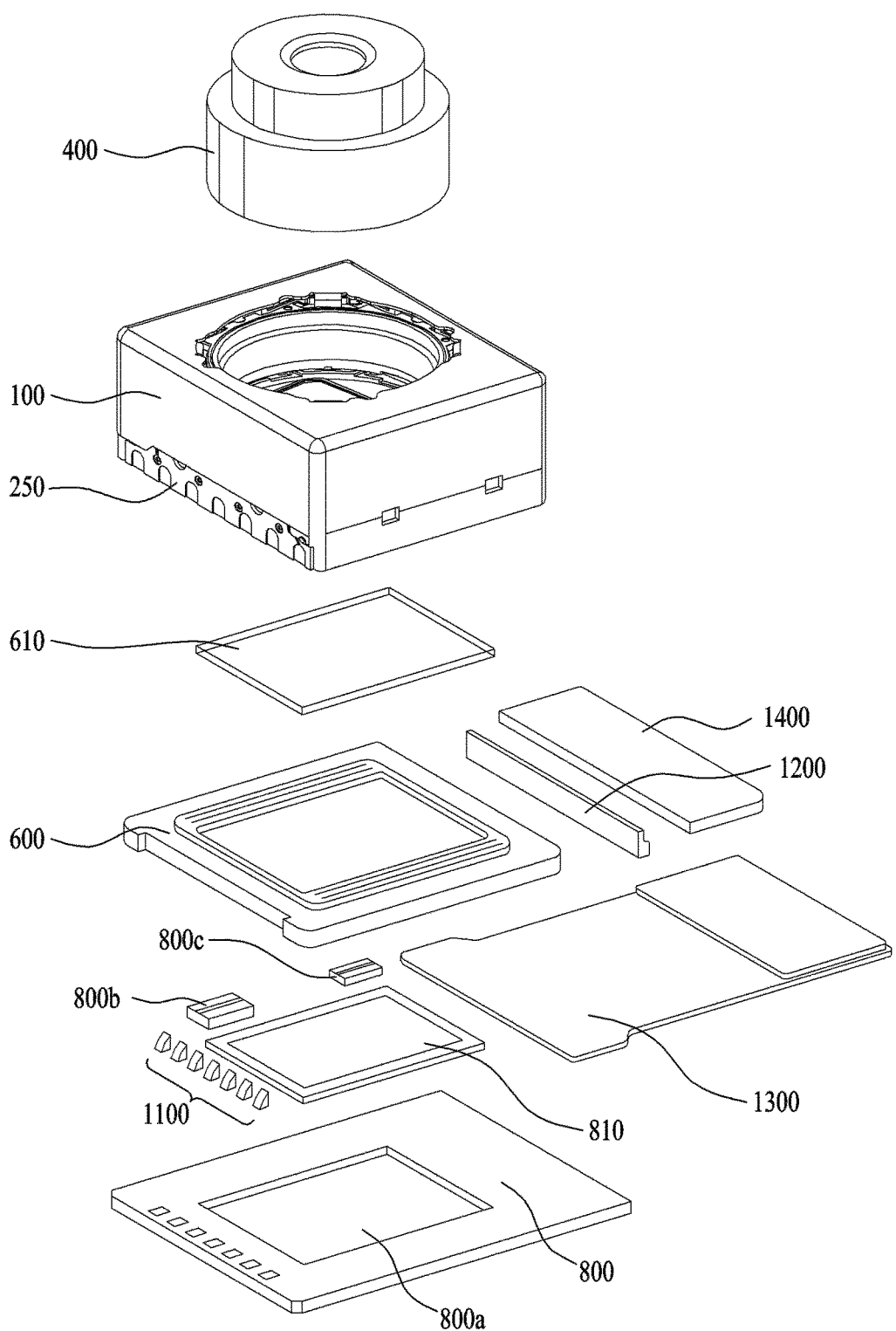
FIG. 5 is an exploded perspective view illustrating the camera module according to an embodiment.

FIGS. 3 and 4 are perspective views illustrating the camera module according to an embodiment. In addition, FIGS. 3 and 4 illustrate the lens barrel 400 according to an embodiment. FIG. 5 is an exploded perspective view illustrating the camera module according to an embodiment.

In this embodiment, the camera module may include the lens barrel 400, the lens driving device 100, a first holder 600, a first circuit board 800, and a flexible circuit board 1300.

The lens barrel 400 can be coupled within the bobbin 110 in various ways. For example, a female thread may be formed on an inner circumference surface of the bobbin 110, and a male thread corresponding to the female thread may be formed on an outer circumference surface of the lens barrel 400. Through the thread coupling, the lens barrel 400 can be coupled to the bobbin 110.

However, the embodiment is not limited thereto. In particular, instead of forming the thread on the inner circumference surface, that is, without the thread coupling, the lens barrel 400 can be directly fixed within the bobbin 110. Alternatively, the bobbin 110 may be integrated with at least one lens without the lens barrel 400.

Meanwhile, in the lens barrel 400, there may be one lens. Alternatively, it may include two or more lens forming an optical system.

The lens barrel 400 may be provided such that it can move up and down in the first direction with respect to the first holder 600 according to the bobbin movement in the first direction, and the lens driving device 100 may perform the auto-focusing function by moving the lens barrel 400 up and down in the first direction.

As shown in FIG. 5, the first holder 600 may be provided at the bottom of the lens driving device 100, and a filter 610 may be mounted thereon. In this case, the filter 610 may be, for example, an infrared cutoff filter.

The first circuit board 800 may be disposed on the bottom of the first holder 600, and the image sensor 810 may be mounted thereon. In addition, the first circuit board 800 may include various elements, for example, an element for transferring an image captured by the image sensor 810 to an external device, an element for receiving power from an external source, etc.

Meanwhile, as shown in FIG. 5, the first circuit board 800 may include a driver IC 800c for controlling operation of the lens driving device 100, a memory 800c for storing information, etc.

The first circuit board may be made of, for example, a high temperature co-fired ceramic (HTCC) material. When the first circuit board 800 is made of the HTCC material, it may be formed as a rigid board rather than a flexible board.

In this case, even if a portion of the first circuit board 800 corresponding to the rigid board has a thin width, it may not be deformed when an external force is applied. Thus, a depressed portion for mounting the image sensor 810 may be formed on the first circuit board 800.

Therefore, as shown in FIG. 5, a mounting groove 800a for mounting the image sensor 810 may be formed on an upper surface of the second folder, which is made of the HTCC material.

When the image sensor 810 is mounted in the mounting groove 800a, the image sensor 810 may not be protruded out of the upper surface of the second folder. That is, the height of the image sensor 810 may be equal to or lower than that of the second folder.

Owing to this structure of the camera module, it is possible to reduce distance between the upper surface of the image sensor 810 and the upper surface of the lens provided within the lens barrel 400, thereby reducing the overall size of the camera module.

In another embodiment, the first circuit board 800 may be made of another material other than the HTCC material. It is a matter of course that a flexible material can be used.

In this case, since the first circuit board 800 does not have sufficient rigidity unlike the HTCC, the depressed portion for mounting the image sensor 810 is not formed on the first circuit board 800, but the image sensor 810 may be mounted such that it is protruded out of the upper surface of the first circuit board 800.

On the other hand, the first circuit board 800 may be made of the same material as the flexible circuit board 1300, which will be described later, and in this case, the first circuit board 800 may be integrated with the flexible circuit board 1300.

The image sensor 810 is mounted on the upper surface of the first circuit board 800. When light that penetrates the lens provided in the lens barrel 400 is received, an image of a subject is focused on the image sensor.

The image sensor 810 may be provided such that it faces the lens provided in the lens barrel 400 and the filter 610 in the first direction. In this case, the image sensor 810 may be placed away from the filter 610 in the first direction.

The flexible circuit board 1300 may be electrically connected to the first circuit board 800 and serves as an electrical path for transmitting signals and providing power between the camera module and an external device by electrically connecting the camera module to the external device.

As shown in FIGS. 4 and 5, one side of the flexible circuit board 1300 is coupled to one surface of the first circuit board 800 so that they are electrically connected to each other. In addition, the other side of the flexible circuit board 1300 may be coupled to a connector (not shown in the drawings) for electrically connecting an external device.

An area of the flexible circuit board 1300, where the flexible circuit board 1300 is coupled to the first circuit board 800, may be made of a flexible material, and an area thereof where the flexible circuit board 1300 is electrically connected to the external device may be implemented as a reinforcement plate for coupling to the connector.

Meanwhile, as shown in FIGS. 3 to 5, the camera module according to this embodiment may include a soldering portion 1100, a coupling reinforcement portion 1200, and an electrically insulating layer 1400.

The soldering portion 1100 may be disposed on one end of the lens driving device 100 and configured to electrically connecting the lens driving device 100 to the first circuit board 800.

Specifically, the soldering portion 1100 may be configured to electrically connecting the terminals 251 provided on the printed circuit board 251 and terminals provided on the first circuit board 800. The printed circuit board 251 receives power through the soldering portion 1100 and then applies current to the first coil so that the lens driving device 100 can perform the auto-focusing function.

The coupling reinforcement portion 1200 may be disposed on the other side of the lens driving device 100 by facing the soldering portion 1100 and configured to couple the lens driving device 100 to the first circuit board 800.

The coupling reinforcement portion 1200 may be formed such that its length direction is perpendicular to the first direction and parallel with a length direction of the soldering portion 1100. In this case, the coupling reinforcement portion 1200 may be made of an epoxy or a thermosetting adhesive.

Referring to FIG. 5, the lens driving device 100 can be strongly coupled to the first circuit board 800 by the soldering portion 1100 around an area of the camera module where the soldering portion 1100 is formed. However, the soldering portion 1100 for coupling the lens driving device 100 and first circuit board 300 may not be formed in an area opposite to the area where the soldering portion 1100 is formed, that is, an area coupled to the flexible circuit board 1300.

That is, since in FIG. 5, the terminals 251 of the printed circuit board 250 may be provided at one side of the lens driving device 100 but may not be provided at the other side thereof, the soldering portion 1100 for connecting the terminals 251 of the printed circuit board 250 and the terminals of the first circuit board 800 may be formed only on the side where the terminals 251 of the printed circuit board 250 are formed.

The components of the camera module including the lens driving device 100 and the first circuit board 800 may be coupled to each other by an adhesive. However, the coupling strength of the adhesive is lower than that of the soldering.

Therefore, if an external force is repeatedly applied to the camera module, the coupling between the lens driving device 100 and first circuit board 800 can be maintained in the vicinity of the soldering portion 1100, but the coupling between the lens driving device 100 and first circuit board 800 may be broken in the opposite area of the soldering portion 1100 due to the repeated external force, that is, the adhesive coupling may be broken.

If part of the coupling area between the lens driving device 100 and first circuit board 800 is broken, the lens driving device 100 may not operate as designed, and thus an error may occur. In addition, the error occurrence may degrade the quality of an image captured by the camera module.

In particular, since the lens driving unit 100 cannot accurately perform the auto-focusing function, the camera module cannot focus on a subject so that the resolution of the image captured by the camera module may be significantly degraded.

Therefore, to maintain the coupling between the lens driving device 100 and first circuit board 800 even when the external force is repeatedly applied to the camera module, the coupling reinforcement portion 1200 needs to be provided at the opposite side of the soldering portion 1100 to reinforce the coupling.

The electrically insulating layer 1400 may be formed on the other surface of the coupling area of the flexible circuit board 1300, where the flexible circuit board 1300 is coupled to the first circuit board 800. The electrically insulating layer 1400 may cover an exposed area of the flexible circuit board 1300 to inhibit various wires, elements, etc. from being short-circuited or disconnected and protect them from outside impacts.

As described above, one side of the flexible circuit board 1300 is coupled to one surface of the first circuit board 800. In addition, the coupling area of the flexible circuit board 1300 where the flexible circuit board 1300 is coupled to the first circuit board 800 may not be covered by an insulator film or the like for the coupling to the first circuit board 800.

Therefore, one surface of the coupling area of the flexible circuit board 1300 where the flexible circuit board 1300 is coupled to the first circuit board 800, that is, the lower surface may be coupled to the first circuit board 800, but the other side, that is, the upper surface may be exposed to the outside without the insulator film or the like.

In addition, the electrically insulating layer 1400 may be formed to protect wires, elements, etc. provided on the exposed upper surface of the coupling area between the flexible circuit board 1300 and first circuit board 800. Of course, it may be made of an electrically insulating material.

When it is looked down in the first direction, it is desirable that the electrically insulating layer 1400 is formed in the shape similar to the protruded area of the first circuit board 800, that is, the protruded area that is not coupled to the lens driving device 100.

Figure 6:
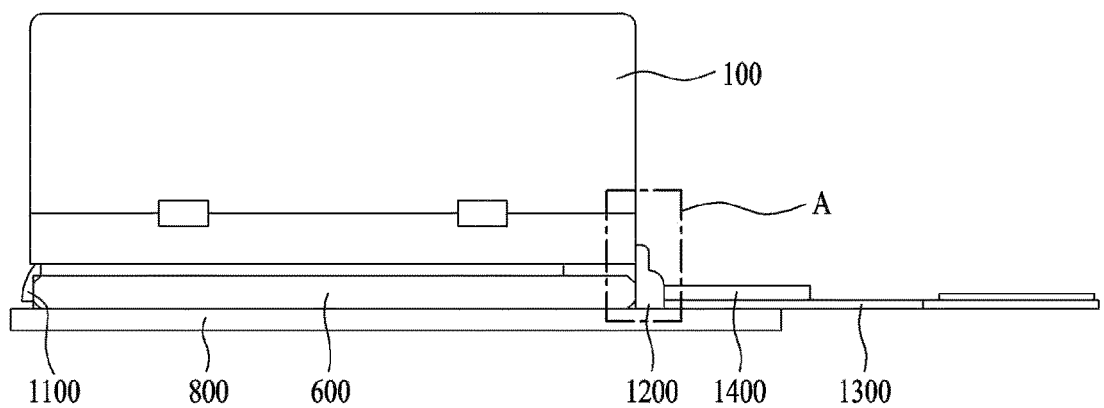
FIG. 6 is a side view illustrating the camera module according to an embodiment.
Figure 7:
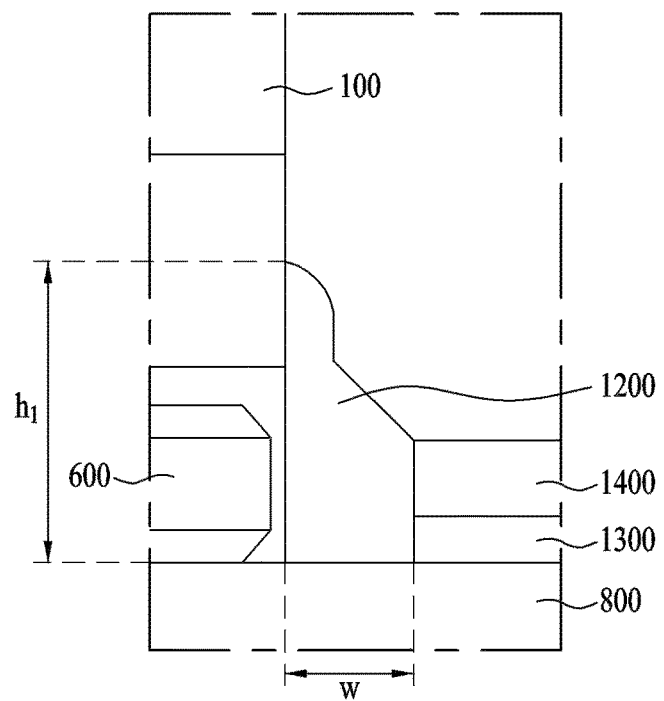
FIG. 7 is a diagram illustrating part A of FIG. 6.

FIG. 6 is a side view illustrating the camera module according to an embodiment, and FIG. 7 is a diagram illustrating part A of FIG. 6. As shown in FIG. 6, the coupling reinforcement portion 1200 may be provided on a side surface of the lens driving device 100, particularly, at the opposite side of the soldering portion 1100.

As shown in FIG. 7, in one embodiment, a lower surface of the coupling reinforcement portion 1200 is coupled to the upper surface of the first circuit board 800, and at least part of the side surface thereof may be coupled to one end of the electrically insulating layer 1400. In addition, at least part of an upper surface of the coupling reinforcement portion 1200 may be coupled to a side surface of a base 250 provided in the lens driving device 100.

Owing to this structure, the coupling reinforcement portion 1200 can be coupled to the lens driving device 100, first circuit board 800, and electrically insulating layer 1400, thereby improving the coupling strength between the lens driving device 100 and first circuit board 800.

Therefore, even when an external force is repeatedly applied to the camera module, it is possible to inhibit or remarkably reduce separation between the lens driving device 100 and first circuit board 800 resulting from a broken coupling therebetween occurring at the opposite side of the soldering portion 1100 while maintaining the coupling therebetween around the soldering portion.

In this embodiment, a width (w) of the lower surface of the coupling reinforcement portion 1200, that is, a width of the area where the lower surface of the coupling reinforcement portion 1200 is coupled to the upper surface of the first circuit board 800 may be set to, for example, from 0.3 mm to 1 mm, and more preferably, to about 0.5 mm.

In addition, in the embodiment, a first height (h1) of the coupling reinforcement portion 1200, that is, a height of the coupling reinforcement portion 1200 measured in the first direction may be set to, for example, from 0.5 mm to 1.5 mm, and more preferably, to about 0.9 mm.

Figure 8:
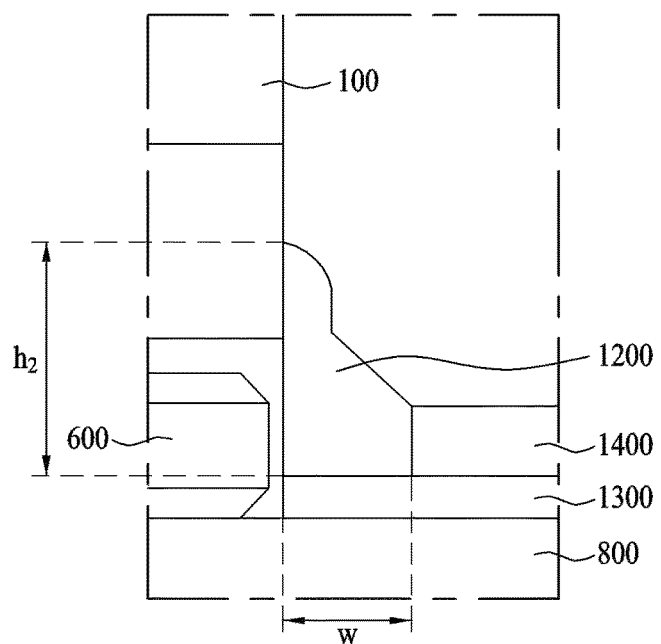
FIG. 8 is a diagram illustrating another embodiment of FIG. 7.

FIG. 8 is a diagram illustrating another embodiment of FIG. 7. As shown in FIG. 8, in another embodiment, the lower surface of the coupling reinforcement portion 1200 may be coupled to the upper surface of the flexible circuit board 1300, and at least part of the side surface thereof may be coupled to one end of the electrically insulating layer 1400. In addition, at least part of the upper surface of the coupling reinforcement portion 1200 may be coupled to the side surface of the lens driving device 100.

According to the embodiment of FIG. 8, unlike the embodiment of FIG. 7, to couple the lower surface of the coupling reinforcement portion 1200 and the upper surface of the flexible circuit board 1300, the flexible circuit board 1300 may be extended toward the lens driving device 100 so that a width of the flexible circuit board 1300 can be equal to or greater than that of the coupling reinforcement portion 1200.

Owing to this structure, the coupling reinforcement portion 1200 can be coupled to the lens driving device 100, flexible circuit board 1300, and electrically insulating layer 1400, thereby improving the coupling strength between the lens driving device 100 and first circuit board 800.

Similarly, in this embodiment, the width (w) of the lower surface of the coupling reinforcement portion 1200, that is, the width of the area where the lower surface of the coupling reinforcement portion 1200 is coupled to the upper surface of the first circuit board 800 may be set to, for example, from 0.3 mm to 1 mm, and more preferably, to about 0.5 mm.

In addition, in the embodiment, a second height (h2) of the coupling reinforcement portion 1200, that is, the height of the coupling reinforcement portion 1200 measured in the first direction may be set to, for example, from 0.5 mm to 1.5 mm, and more preferably, to about 0.9 mm.

However, considering a thickness of the flexible circuit board 1300, the first height (h1) of the coupling reinforcement portion 1200 in the embodiment of FIG. 7 may be set to be higher than the second height (h2) of the coupling reinforcement portion 1200 in the embodiment of FIG. 8.

In the embodiments, even when an external force is applied to the camera module, the coupling reinforcement portion 1200 can inhibit the lens driving device 100 and first circuit board 800 from being separated from each other. Therefore, it is possible to inhibit the quality and resolution of images from being degraded due to the separation between the lens driving device 100 and first circuit board 800.

Figure 9:
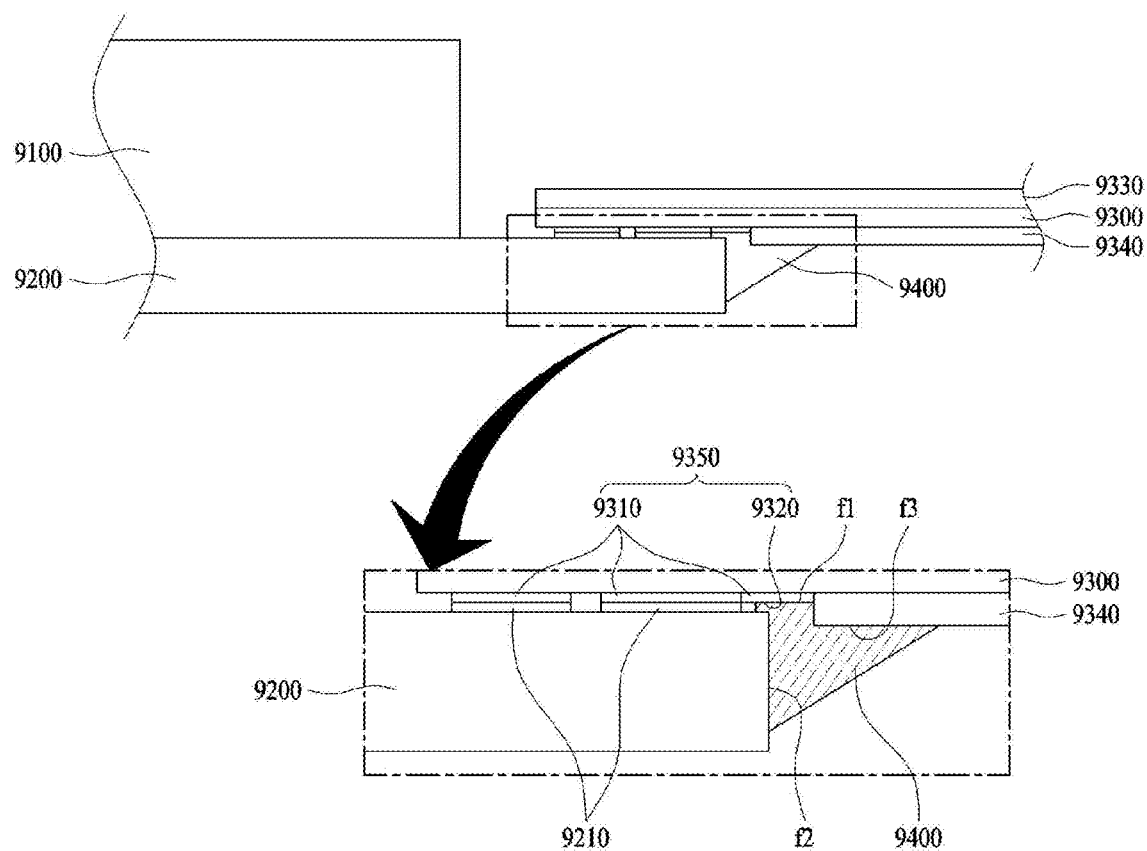
FIG. 9 is a schematic side view of a camera module according to another embodiment.

FIG. 9 is a schematic side view of a camera module according to another embodiment. According to this embodiment, the camera module can be applied mobile devices such as a smart phone, table PC, and the like.

As shown in FIG. 9, the camera module may include a lens driving device 9100, a first circuit board 9200, and a second circuit board 9300. In addition, the lens driving device 9100 may include an auto-focusing device for automatically focusing on a lens in an optical axis direction and a vibration compensation mechanism for inhibiting image quality degradation due to user's hand shaking.

The first circuit board 9200 may be coupled to the lens driving device 9100 electrically and mechanically, control operation of the lens driving device 9100, and provide power required for driving the lens driving device 9100 to the lens driving device 9100.

The first circuit board 9200 may include an IC driver for driving the lens driving device 9100 and various other elements. In this case, the first circuit board 9200 can be made of a rigid material, which is hardly bent when an external force is applied, in order to maintain the coupling between the lens driving device 9100 and first circuit board 9200 and protect various elements mounted thereon.

The first circuit board 9200 may be made of a high temperature co-fired ceramic (HTCC) material. The HTCC is rigid and hardly bent. Thus, when the first circuit board 9200 is coupled to the second circuit board 9300 made of a flexible material, which will be described later, the coupling area between the first and second circuit boards 9200 and 9300 may be broken because the second circuit board 9300 is repeatedly deformed.

Thus, in this embodiment, a camera module structure capable of inhibiting the coupling area between the first and second circuit boards 9200 and 9300 from being broken is proposed. Details will be explained in the following description.

In addition, the first circuit board 9200 may include an image sensor (not shown in the drawing) for allowing an image captured by the camera module to be focused on itself. In this case, the image sensor may be provided such that it faces at least one lens provided in the lens driving device 9100 in the optical axis direction.

Meanwhile, a first terminal 9210 may be provided on one surface of the first circuit board 9200. The first terminal 9210 is coupled to a second terminal 9310 provided on the second circuit board 9300, and thus the first circuit board 9200 can be electrically connected to the second circuit board 9300.

The first terminal 9210 may be formed as a thin film at a predetermined area of one surface of the first circuit board 9200 using, for example, photo-masking and the like. The second terminal 9310, which will be described later, may be formed as a thin film at a predetermined area of one surface of the second circuit board 9300 using the photo-masking.

As another embodiment, the first and second terminals 9210 and 9310 may be respectively coupled to one side of the first and second circuit boards 9200 and 9300 using an AFC bonding scheme, which will be described later. When this scheme is used, since ACF bonding is a conductive adhesive, the first and second terminals 9210 and 9310 can be electrically connected to circuit patterns formed on the first and second circuit boards 9200 and 9300, respectively.

The second circuit board 9300 is electrically connected to the first circuit board 9200, and it can serve as a path for transferring a signal containing image information, which is transmitted from the image sensor provided in the first circuit board 9200, to external devices such as a memory, a display, etc.

In addition, the second circuit board 9300 can serve as a path for receiving current required for driving the lens driving device from an external power source and then transferring the current to the first circuit board 9200.

To this end, the second terminal 9310 to be coupled to the first terminal 9210 can be formed on one surface of the second circuit board 9300. When the first and second terminals 9210 and 9310 are coupled electrically and mechanically, the first and second circuit board can be electrically connected to each other.

For example, the first and second terminals 9210 and 9310 may be coupled to each other using the anisotropic conductive film (ACF) bonding scheme. For instance, a conductive film adhesive may be spread on a coupling surface between the first and second terminals 9210 and 9310. When the first and second terminals 9210 and 9310 are coupled by the adhesive, the first and second terminals 9210 and 9310 can be electrically connected to each other.

The second circuit board 9300 needs to be coupled to other external device. In this case, since the external devices may be disposed at random positions, the second circuit board 9300 can be made of a flexible material to be coupled to these external devices. For example, the second circuit board 9300 may be made of a polyimide having flexibility and durability.

In addition, the second circuit board 9300 can be implemented such that a plurality of pattern layers are layered. In this case, circuit patterns, elements, etc. may be formed in each pattern layer, and a via for electrically connecting the pattern layers may be formed in each pattern layer.

A first cover layer 9330 and a second cover layer 9340 may be formed in the second circuit board 9300. The first cover layer 9330 is coupled to an upper surface of the second circuit board 9300, and the second cover layer 9340 is coupled to a lower surface of the second circuit board 9300. In this case, each of the first and second cover layers 9330 and 9340 may be made of an electrically insulating material. Thus, the first and second cover layers 9330 and 9340 may be configured to cover and protect exposed circuit patterns, elements, and the like of the second circuit board 9300 and electrically insulate them from the outside.

The first cover layer 9330 is applied or attached to the upper surface of the second circuit board 9300. In addition, since the first cover layer 9330 may be formed by cutting off one side of the second circuit board 9300, the first cover layer 9330 and one end of the second circuit board 9300 may be respectively placed at up and down positions as shown in FIG. 9.

To form a plating layer 9350 at one end of the second layer 9340, which will be explained in the following description, the second layer 9340 may be shorter than the second circuit board 9300 by a length of the plating layer 9350.

Meanwhile, when the first terminal 9210 is coupled to the second terminal 9310, the second terminal 9310 may be partially exposed. The exposed area 9320 may be the lower surface of the second circuit board 9300 at space between one end of the first circuit board 9200 and one end of the second circuit board 9300 as shown in FIG. 9.

As shown in FIG. 9, the plating layer 9350 may be provided on the lower surface of the second circuit board 9300. The plating layer 9350 is provided next to one side of the second cover layer 9340 on the lower surface of the second circuit board 9300 and corresponds to an area where the second terminal 9310 is provided.

In other words, the plating layer 9350 is formed in an area where the second cover layer 9340 is not formed on the lower surface of the second circuit board 9300, that is, an area from one end of the second circuit board 9300 to one end of the second cover layer 9340. The second terminal 9310 may be provided on the plating layer 9350, and the exposed area 9320 may correspond to part of the plating layer 9350.

This exposed area 9320 may be formed for the following reasons: working tolerance occurring in the course of coupling the first and second terminals 9210 and 9310 occurs; and abrasion caused by when one end of the first terminal 9210 is contacted with one end of the second cover layer 9340 should be inhibited.

At least part of the second terminal 9310 may be disposed on the exposed area 9320. The second circuit board 9300 made of the flexible material may be deformed, for example, it may be bent if an external force is applied while the camera module is assembled or if the camera module is used after the completion of the assembly.

If the second circuit board 9300 is continuously and repeatedly deformed, the coupling between the first and second terminals 9210 and 9310 may be broken or damaged. In particular, since stress caused by the deformation of the second circuit board 9300 may be concentrated on the second terminal 9310 or circuit pattern disposed on the exposed area 9320, cracks may intensively occur at the second terminal 9310 or circuit pattern.

The damages and cracks occurring at the circuit pattern formed across the first terminal 9210, second terminal 9310, and second circuit board 9300 may break the electrical connection between the first and second circuit boards 9200 and 9300 or cause malfunction of the camera module.

Thus, according to this embodiment, the plating layer 9350 of the camera module, more particularly, the exposed area 9320 of the plating layer 9350 should be protected from the damages and cracks caused by the deformation of the second circuit board 9300. To this end, a first reinforcement portion 9400, a second reinforcement 9500, and a third reinforcement portion 9600 can be provided in the camera module.

Hereinafter, a description will be given of details of the first reinforcement portion 9400. The second and third reinforcement portions 9500 and 9600 will be described in detail with reference to FIG. 10.

The first reinforcement portion 9400 may be provided such that it covers the exposed area 9320. That is, when the first and second terminals 9210 and 9310 are coupled, the first reinforcement portion 9400 may be respectively coupled to the first and second circuit boards 9200 and 9300 while covering the exposed area 9320 of the second terminal 9310. Due to such a structure, the first reinforcement portion 9400 can restrict the deformation around the plating layer 9350 including the exposed area 9320 of the second circuit board 9300.

As shown in FIG. 9, the exposed area 9320 of the second terminal 9310 may be formed on the lower surface of the second circuit board 9300, that is, part of the plating layer 9350. In particular, the first reinforcement portion 9400 may cover the exposed area 9320.

Since the first reinforcement portion 9400 covers the exposed area 9320, the first reinforcement portion 9400 may restrict the deformation around the plating layer 9350 and electrically insulate the first terminal 9210 that may be formed in the exposed area 9320 from the outside.

A part of the first reinforcement portion 9400 may be coupled to the exposed area 9320 of the second terminal 9310, another part thereof may be coupled to a side surface of the first circuit board 9200, and the other part thereof may be coupled to the rest on the lower surface of the second circuit board 9300 except the exposed area 9320.

Specifically, as shown in FIG. 9, a first surface f1, which is protruded upward, on an upper surface of the first reinforcement portion 9400, may be coupled to the exposed area 9320 of the second terminal 9310. A second surface f2 on a side surface of the first reinforcement portion 9400 may be coupled to a side surface of the first surface 9200, that is, one end of the first circuit board 9200.

A third surface f3 except the first surface f1 on the upper surface of the first reinforcement portion 9400 may be coupled to an area except the exposed area 9320 on the lower surface of the second circuit board 9300, that is, a part of a lower surface of the second cover layer 9340.

Due to such a structure, the first reinforcement portion 9400 may electrically insulate the second terminal 9310 from the outside by covering the exposed area 9320 and restrict the deformation around the plating area 9350 of the second circuit board 9300.

The first reinforcement portion 9400 can be made of an ultraviolet setting material, a thermosetting material, or an adhesive. For example, if an ultraviolet setting or thermosetting adhesive is applied to the area shown in FIG. 9 enough to be attached to the exposed area 9320 and then ultraviolet light or heat is applied to the adhesive, the adhesive can be hardened. By doing so, the first reinforce portion 9400 can be formed.

Meanwhile, since the first reinforcement portion 9400 can also electrically insulate the first terminal 9210 provided in the exposed area 9320 from the outside, it is desirable that the first reinforcement portion 9400 is made of an electrically insulating material.

In this embodiment, since the camera module has the structure where the first reinforcement portion 9400 covers the exposed area 9320 where the second terminal 9310 is exposed, it is possible to restrict the deformation of the second circuit board 9300, which is made of a flexible material. Thus, it is also possible to inhibit or remarkably reduce the occurrence of damages and cracks at the circuit pattern formed across the first terminal 9210, second terminal 9310, and second terminal 9300, which is caused by the deformation of the second circuit board 9300.

Figure 10:
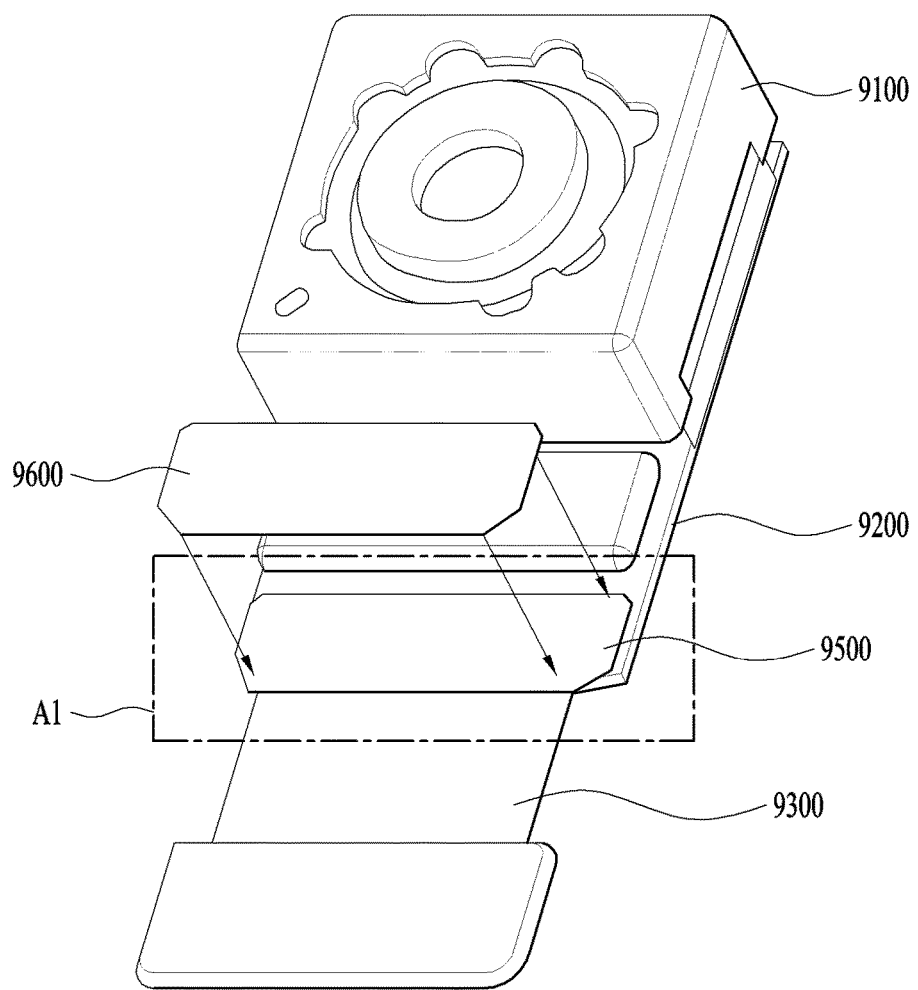
FIG. 10 is a perspective view of a camera module according to a further embodiment.
Figure 11:
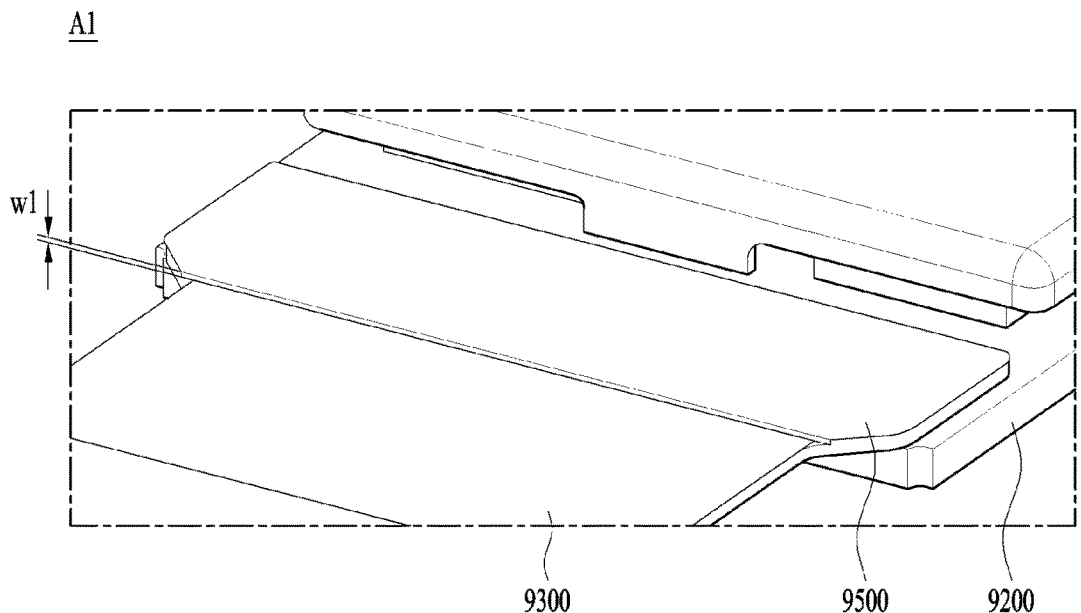
FIG. 11 is an enlarged view illustrating part A1 of FIG. 10.

FIG. 10 is a perspective view of a camera module according to a further embodiment, and FIG. 11 is an enlarged view illustrating part A1 of FIG. 10. In this embodiment, the camera module may further include the second reinforcement portion 9500 and the third reinforcement portion 9600 as well as the first reinforcement portion 9400.

As shown in FIG. 10, the second reinforcement portion 9500 can be coupled to the upper surface of the second circuit board 9300. Similar to the first reinforcement portion 9400, the second reinforcement portion 9500 can inhibit the occurrence of damages and cracks at the circuit pattern formed across the first terminal 9210, second terminal 9310, and second terminal 9300 by restricting the deformation of the second circuit board 9300.

Figure 12:
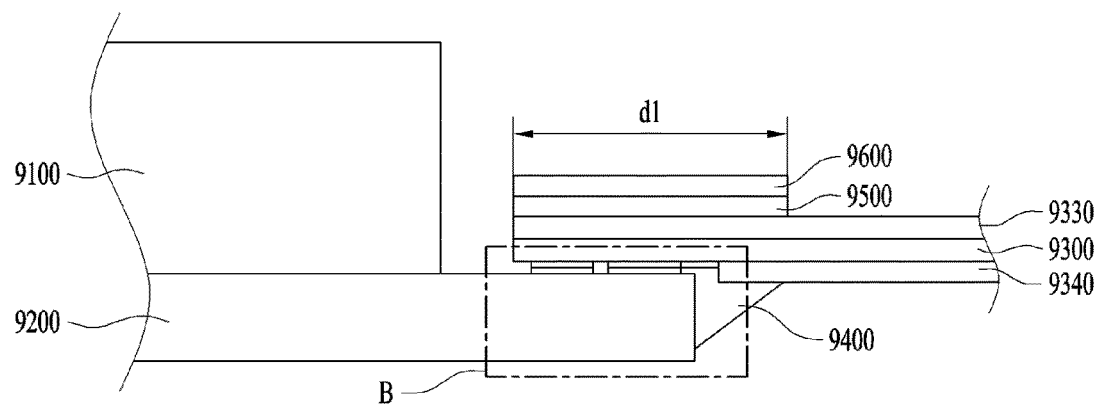
FIG. 12 is a schematic side view of the camera module according to the embodiment of FIG. 10.

The second reinforcement portion 9500 is formed on the lower surface of the second circuit board 9300, and more specifically, it may be formed in an area corresponding to the plating layer 9350 including the exposed area 9320. Referring to FIG. 12, it is desirable to form the second reinforcement portion 9500 to be longer than the plating layer 9350 in a length direction of the second circuit board 9300.

Due to such a structure, the second reinforcement portion 9500 can efficiently inhibit or remarkably reduce the occurrence of the damages and cracks by restricting the deformation of the second circuit board 9300 in a sufficiently large area including the plating layer 9350.

Referring again to FIG. 12, for example, the second reinforcement portion 9500 is attached to an upper surface of the first cover layer 9330. One end of the second reinforcement portion 9500 is disposed at a position corresponding to one end of each of the first circuit board 9200 and first cover layer 9330 in the length direction of the first circuit board 9200, and the other side of the second reinforcement portion 9500 may be extended further than one end of the plating layer 9350 in the length direction of the first circuit board 9200.

The second reinforcement portion 9500 may be attached to the upper surface of the first cover layer 9330 by an adhesive. In this case, the adhesive is applied in the form of a thin film. However, if the adhesive has a certain level of stiffness after hardening, the adhesive may restrict the deformation of the second circuit board 9300, for example, bending of the second circuit board 9300 together with the second reinforcement portion 9500.

Thus, the second reinforcement portion 9500 may be made of the same flexible material as the second circuit board 9300, for example, a polyimide. This is because considering that the second reinforcement portion 9500 has a certain thickness and the adhesive for bonding the second reinforcement portion 9500 and first cover layer 9330 has a certain level of stiffness, the structure where the second reinforcement portion 9500 made of the flexible material is combined with the adhesive has enough stiffness to efficiently restrict the deformation of the second circuit board 9300 even when the second reinforcement portion 9500 is made of a flexible material.

Of course, in another embodiment, the second reinforcement portion 9500 may be made of a material with high stiffness, which is different from that of the second circuit board 9300, to efficiently restrict the deformation of the second circuit board 9300.

Meanwhile, referring to FIG. 11, the second reinforcement portion 9500 may be formed as a plate. In addition, a width w1 of the second reinforcement portion 9500 may be set to from 0.1 mm to 0.3 mm, and more preferably, to about 0.2 mm. The width w1 of the second reinforcement portion 9500 may be set different from the above-mentioned values according to the overall size, particular shape and the like of the camera module.

The third reinforcement portion 9600 is coupled to an upper surface of the second reinforcement portion 9500, and it may be formed in the shape corresponding to the second reinforcement portion 9500. Similar to the second reinforcement portion 9500, the third reinforcement portion 9600 may inhibit the occurrence of damages and cracks at the circuit pattern formed across the first terminal 9210, second terminal 9310, and second terminal 9300 by restricting the deformation of the second circuit board 9300.

The third reinforcement portion 9600 may be attached to the upper surface of the second reinforcement portion 9500 by an adhesive. Similar to the second reinforcement portion 9500, if the adhesive has a certain level of stiffness after hardening, the adhesive may restrict the deformation of the second circuit board 9300, for example, bending of the second circuit board 9300 together with the third reinforcement portion 9600.

Similar to the second reinforcement portion 9500, the third reinforcement portion 9600 may be made of the same flexible material as the second circuit board 9300, for example, the polyimide. In another embodiment, the third reinforcement portion 9600 may be made of a material with high stiffness, which is different from that of the second circuit board 9300. Since the details are the same those of the second reinforcement portion 9500, description thereof will be omitted.

The structure including the second reinforcement portion 9500, third reinforcement portion 9600, and adhesive therebetween is advantageous in that stiffness can be improved, compared to the structure having only the second reinforcement portion 9500 with the same thickness.

Figure 13:
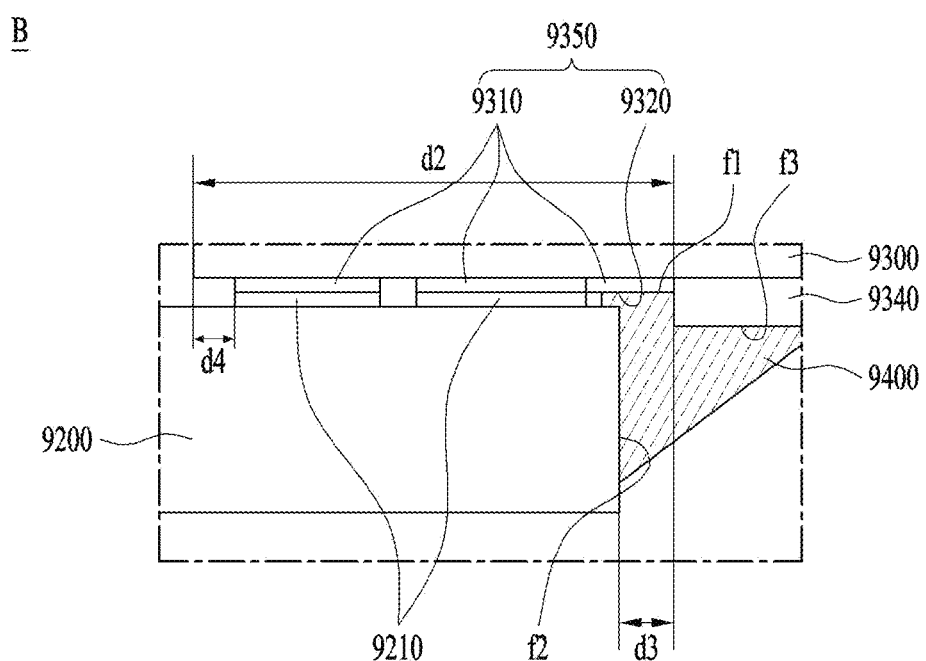
FIG. 13 is an enlarged view illustrating part B of FIG. 12.

FIG. 12 is a schematic side view of the camera module according to the embodiment of FIG. 10, and FIG. 13 is an enlarged view illustrating part B of FIG. 12. Compared to FIG. 9 where only the first reinforcement portion 9400 is illustrated, FIGS. 12 and 13 show all of the first reinforcement portion 9400 second reinforcement portion 9500, and third reinforcement portion 9600.

It is apparent that as an embodiment, only one of the first reinforcement portion 9400 second reinforcement portion 9500, and third reinforcement portion 9600 or any combination of two or more of them can be provided in the camera module.

As shown in FIG. 12, the second reinforcement portion 9500 has a first length d1 in the length direction of the second circuit board 9300, and the first length d1 may be set to from 2 mm to 4 mm, and more preferably, to about 3 mm.

As shown in FIG. 13, the plating layer has a second length d2 in the length direction of the second circuit board 9300, and the second length d2 may be set to from 1.5 mm to 2.5 mm, and more preferably, to about 2 mm.

In addition, the exposed area 9320 has a third length d3 in the length direction of the second circuit board 9300, and the third length d2 may be set to from 0.05 mm to 0.15 mm, and more preferably, to about 0.1 mm.

The first length d1, second length d2, and third length d3 may be set different from the above-mentioned values according to the overall size, particular shape, and the like of the camera module.

Meanwhile, as shown in FIG. 13, one end of the second terminal 9310 may be provided away from one end of the second circuit board 9300. This is because if the second terminal 9310 is extended to the end of the second circuit board 9300, the second terminal 9310 may be exposed to the outside and thus, it may cause negative effects on operation of the camera module.

Therefore, a length d4 corresponding to a distance from the end of the second terminal 9310 to the end of the second circuit board 9300 may be properly selected by considering the total size, structure, etc. of the camera module.

According to this embodiment, when the second reinforcement portion 9500 or third reinforcement portion 9600 is provided in the camera module, the camera module can inhibit or remarkably reduce the occurrence of damages and cracks at the circuit pattern formed in the first terminal 9210, second terminal 9310, and second circuit board 9300 by restricting the deformation of the second circuit board 9300, which is made of a flexible material.

Although only a few embodiments have been described above, various other embodiments may be implemented. The above-described technical features of the embodiments may be combined into various forms unless the technical features are incompatible with each other, and in which case new embodiments can be implemented using the combined features.

INDUSTRIAL APPLICABILITY

According to the embodiments, even when an external force is repeatedly applied to the camera module, it is possible to inhibit or remarkably reduce the occurrence of separation between the lens driving device and first circuit board resulting from a broken coupling therebetween at the opposite side of the soldering portion while maintaining the coupling therebetween around the soldering portion. Therefore, the camera module has industrial applicability.

The invention claimed is:

1. A camera module, comprising:
a first circuit board comprising a first terminal;
an image sensor disposed on the first circuit board;
a lens moving device comprising a lens barrel disposed on the image sensor and a second circuit board comprising a second terminal;
a soldering portion connecting the first terminal of the first circuit board and the second terminal of the second circuit board; and
a coupling reinforcement portion coupling the lens moving device and the first circuit board;
wherein the coupling reinforcement portion and the soldering portion are located opposite to each other with the lens moving device interposed therebetween.

2. The camera module of claim 1, comprising a filter disposed between the lens barrel and the image sensor.

3. The camera module of claim 1, wherein the first circuit board is electrically connected to the second circuit board through the soldering portion.

4. The camera module of claim 1, wherein a lower surface of the coupling reinforcement portion is coupled to an upper surface of the first circuit board.

5. The camera module of claim 1, comprising a flexible circuit board disposed on an upper surface of the first circuit board, and wherein the flexible circuit board is electrically connected to the first circuit board.

6. The camera module of claim 5, wherein a lower surface of the coupling reinforcement portion is coupled to an upper surface of the flexible circuit board.

7. The camera module of claim 6, comprising an insulating layer disposed on the upper surface of the flexible circuit board.

8. The camera module of claim 7, wherein the coupling reinforcement portion is coupled to the insulating layer.

9. The camera module of claim 8, wherein the coupling reinforcement portion comprises an upper end that is located higher than an upper surface of the insulating layer.

10. The camera module of claim 1, wherein a longitudinal direction of the coupling reinforcement portion is in parallel with a longitudinal direction of the soldering portion.

11. The camera module of claim 1, wherein the coupling reinforcement portion comprises a first portion, and wherein a width of the first portion of the coupling reinforcement portion decreases with increasing distance from the first circuit board.

12. The camera module of claim 11, wherein the coupling reinforcement portion comprises a second portion disposed under the first portion of the coupling reinforcement portion.

13. The camera module of claim 7, wherein the coupling reinforcement portion comprises:
a first portion, wherein a width of the first portion of the coupling reinforcement portion decreases with increasing distance from the first circuit board; and
a second portion disposed under the first portion of the coupling reinforcement portion, wherein the second portion is coupled to the flexible circuit board and the insulating layer.

14. The camera module of claim 6, wherein a height of the coupling reinforcement portion is greater than a height of the insulating layer with respect to the upper surface of the flexible circuit board.

15. The camera module of claim 1, wherein the lens moving device comprises:
a housing;
a bobbin disposed in the housing and coupled to the lens barrel;
a coil and a magnet configured to move the lens barrel in a direction parallel to an optical axis of the lens barrel; and
a base disposed under the bobbin.

16. The camera module of claim 1, wherein the second terminal of the second circuit board is disposed on a first side surface of the base, and
wherein at least one part of the coupling reinforcement portion is coupled to a second side surface of the base, and the second side surface of the base is opposite to the first side surface of the base.

17. The camera module of claim 1, wherein the coupling reinforcement portion is made of an epoxy or a thermosetting adhesive.

18. A camera module, comprising:
a first circuit board comprising a first terminal;
an image sensor disposed on the first circuit board;
a lens moving device comprising a lens barrel disposed on the image sensor, a bobbin coupled to the lens barrel and configured to move in a first direction, a second circuit board comprising a second terminal, and a base disposed under the second circuit board;
a soldering portion connecting the first terminal of the first circuit board and the second terminal of the second circuit board; and
a coupling reinforcement portion coupling the base and the first circuit board;
wherein the coupling reinforcement portion and the soldering portion are located opposite to each other with the base interposed therebetween.

19. The camera module of claim 1, wherein the second terminal of the second circuit board is disposed on a first side surface of the base, and
wherein at least one part of the coupling reinforcement portion is coupled to a second side surface of the base, and the second side surface of the base is opposite to the first side surface of the base.

20. A mobile device comprising the camera module according to claim 1.

* * * * *